(12) United States Patent
Scanlan et al.

(10) Patent No.: US 7,829,990 B1
(45) Date of Patent: Nov. 9, 2010

(54) STACKABLE SEMICONDUCTOR PACKAGE INCLUDING LAMINATE INTERPOSER

(75) Inventors: Christopher M. Scanlan, Chandler, AZ (US); Christopher J. Berry, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 497 days.

(21) Appl. No.: 11/624,648

(22) Filed: Jan. 18, 2007

(51) Int. Cl.
  *H01L 23/02* (2006.01)
(52) U.S. Cl. .................................................. 257/686
(58) Field of Classification Search ............... 257/676, 257/686, 635, 736, 777, 783, 788, 690, E23.178, 257/E23.061, E23.169, E23.001, E23.145–E23.146, 257/E23.151, E23.168, E21.59; 438/124, 438/126, 127, 118
  See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Wai-Sing Louie
*Assistant Examiner*—Sue Tang
(74) *Attorney, Agent, or Firm*—Stetina Brunda Garred & Brucker (57) ABSTRACT

An interconnect structure (i.e., a laminate interposer) which is mounted to a semiconductor package leadframe or substrate prior to molding the package body of the semiconductor package. During the molding process, the top of the laminate interposer is protected such that the top surface of the interposer is exposed subsequent to the completion of the molding process. In this manner, electrical signals can be routed from the package leadframe or substrate to the top surface of the package body of the semiconductor package. Subsequently, a mating package can be mounted on top of the underlying package by way of a ball grid array (BGA) interconnect or other type of interconnect.

19 Claims, 4 Drawing Sheets

U.S. PATENT DOCUMENTS

| | | | |
|---|---|---|---|
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,434,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |

| | | | | | | |
|---|---|---|---|---|---|---|
| 6,208,020 B1 | 3/2001 | Minamio et al. | | 6,624,005 B1 | 9/2003 | DiCaprio et al. |
| 6,208,021 B1 | 3/2001 | Ohuchi et al. | | 6,667,546 B2 | 12/2003 | Huang et al. |
| 6,208,023 B1 | 3/2001 | Nakayama et al. | | 7,005,327 B2 | 2/2006 | Kung et al. |
| 6,211,462 B1 | 4/2001 | Carter, Jr. et al. | | 7,190,062 B1* | 3/2007 | Sheridan et al. ............. 257/686 |
| 6,218,731 B1 | 4/2001 | Huang et al. | | 7,327,554 B2* | 2/2008 | Otsuka et al. ............ 361/306.3 |
| 6,222,258 B1 | 4/2001 | Asano et al. | | 7,388,280 B2* | 6/2008 | Shim et al. .................. 257/666 |
| 6,222,259 B1 | 4/2001 | Park et al. | | 2001/0008305 A1 | 7/2001 | McLellan et al. |
| 6,225,146 B1 | 5/2001 | Yamaguchi et al. | | 2001/0014538 A1 | 8/2001 | Kwan et al. |
| 6,229,200 B1 | 5/2001 | McClellan et al. | | 2002/0011654 A1 | 1/2002 | Kimura |
| 6,229,205 B1 | 5/2001 | Jeong et al. | | 2002/0024122 A1 | 2/2002 | Jung et al. |
| 6,239,367 B1 | 5/2001 | Hsuan et al. | | 2002/0027297 A1 | 3/2002 | Ikenaga et al. |
| 6,239,384 B1 | 5/2001 | Smith et al. | | 2002/0109237 A1* | 8/2002 | Oka ........................... 257/777 |
| 6,242,281 B1 | 6/2001 | McClellan et al. | | 2002/0140061 A1 | 10/2002 | Lee |
| 6,256,200 B1 | 7/2001 | Lam et al. | | 2002/0140068 A1 | 10/2002 | Lee et al. |
| 6,258,629 B1 | 7/2001 | Niones et al. | | 2002/0163015 A1 | 11/2002 | Lee et al. |
| 6,281,566 B1 | 8/2001 | Magni | | 2003/0030131 A1 | 2/2003 | Lee et al. |
| 6,281,568 B1 | 8/2001 | Glenn et al. | | 2003/0073265 A1 | 4/2003 | Hu et al. |
| 6,282,095 B1 | 8/2001 | Houghton et al. | | 2004/0056277 A1 | 3/2004 | Karnezos |
| 6,285,075 B1 | 9/2001 | Combs et al. | | 2004/0061212 A1 | 4/2004 | Karnezos |
| 6,291,271 B1 | 9/2001 | Lee et al. | | 2004/0061213 A1 | 4/2004 | Karnezos |
| 6,291,273 B1 | 9/2001 | Miyaki et al. | | 2004/0063242 A1 | 4/2004 | Karnezos |
| 6,294,100 B1 | 9/2001 | Fan et al. | | 2004/0063246 A1 | 4/2004 | Karnezos |
| 6,294,830 B1 | 9/2001 | Fjelstad | | 2004/0065963 A1 | 4/2004 | Karnezos |
| 6,295,977 B1 | 10/2001 | Ripper et al. | | 2004/0164387 A1 | 8/2004 | Ikenaga et al. |
| 6,297,548 B1 | 10/2001 | Moden et al. | | 2005/0218518 A1* | 10/2005 | Jiang et al. .................. 257/738 |
| 6,303,984 B1 | 10/2001 | Corisis | | 2007/0108568 A1* | 5/2007 | Shim et al. .................. 257/676 |
| 6,303,997 B1 | 10/2001 | Lee | | 2007/0290313 A1* | 12/2007 | Partridge .................... 257/686 |
| 6,307,272 B1 | 10/2001 | Takahashi et al. | | 2008/0142938 A1* | 6/2008 | Chow et al. ................. 257/676 |
| 6,309,909 B1 | 10/2001 | Ohgiyama | | | | |

FOREIGN PATENT DOCUMENTS

| | | |
|---|---|---|
| 6,316,822 B1 | 11/2001 | Vekateshwaran et al. |
| 6,316,838 B1 | 11/2001 | Ozawa et al. |

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |

| | | |
|---|---|---|
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,476,469 B2 | 11/2002 | Huang et al. |
| 6,476,474 B1 | 11/2002 | Hung |
| 6,482,680 B1 | 11/2002 | Khor et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,521,987 B1* | 2/2003 | Glenn et al. ................. 257/684 |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,583,503 B2 | 6/2003 | Akram et al. |
| 6,603,196 B2 | 8/2003 | Lee et al. |

| | | |
|---|---|---|
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

STACKABLE SEMICONDUCTOR PACKAGE INCLUDING LAMINATE INTERPOSER

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package which includes an embedded laminate interposer configured to allow a mating semiconductor package to be mounted and electrically connected thereto.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

Even though semiconductor packages have been miniaturized, space on a printed circuit board remains limited and precious. Thus, there is a need to find a semiconductor package design to maximize the number of semiconductor packages that may be integrated into an electronic device, yet minimize the space needed to accommodate these semiconductor packages. One method to minimize space needed to accommodate the semiconductor packages is to stack the semiconductor packages on top of each other, or to stack individual semiconductor devices or other devices within the package body of the semiconductor package. However, when attempting to integrate a large number of devices such as memory chips into a vertical stack, test yield loss typically becomes higher as more such devices are assembled in a single package. As a result, it becomes desirable to use multiple packages which each contain a subset of the memory chips or devices to be integrated vertically. Existing solutions for package stacking such as straddle mount laminate BGA or stacked die TSOP often do not meet form factor requirements. Therefore, a new solution is needed. The present invention is an extension of the stacking solution for space efficiency in that it is directed to, among other things, a semiconductor package which includes an embedded laminate interposer configured to allow a mating semiconductor package to be mounted and electrically connected thereto. In this regard, the present invention provides a three-dimensional packaging solution which is required for, among other things, high density NAND Flash integration. These, as well as other features and attributes of the present invention will be discussed in more detail below.

BRIEF SUMMARY OF THE INVENTION

In accordance with one aspect of the invention, there is provided a two sided interconnect structure (i.e., a laminate interposer) which is mounted to a semiconductor package leadframe or substrate prior to molding the package body of the semiconductor package. During the molding process, the top of the laminate interposer is protected such that the top surface of the interposer is exposed subsequent to the completion of the molding process. In this manner, electrical signals can be routed from the package leadframe or substrate to the top surface of the package body of the semiconductor package. Subsequently, a mating package can be mounted on top of the underlying package by way of a ball grid array (BGA) interconnect or other type of interconnect. The interposer may be mounted to the package leadframe or substrate using a standard BGA interconnect method. During molding of the package body, the mold compound will flow underneath the interposer and between the BGA joints, thus helping to lock the interposer in place in the completed semiconductor package. The interposer may be mounted to a substrate strip with an array of units so that a single interposer strip or frame is attached to adjacent units. During singulation (i.e., the separation of the completed units or semiconductor packages from each other), the interposer is separated so that the interposer is exposed on the side of the semiconductor package. Locking features may be added to the laminate interposer to improve reliability.

In accordance with another aspect of the present invention, there is provided a chip stack wherein multiple semiconductor packages (e.g., QFN packages) are stacked together using a laminate interposer. The leads of the semiconductor packages integrated into the stack are extended to provide a mounting surface for the laminate interposer. The laminate interposer provides routing between the bottom and top packages in the stack. This is required to route chip-select signals in such a way that all the semiconductor packages in the stack may have identical bond diagrams.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
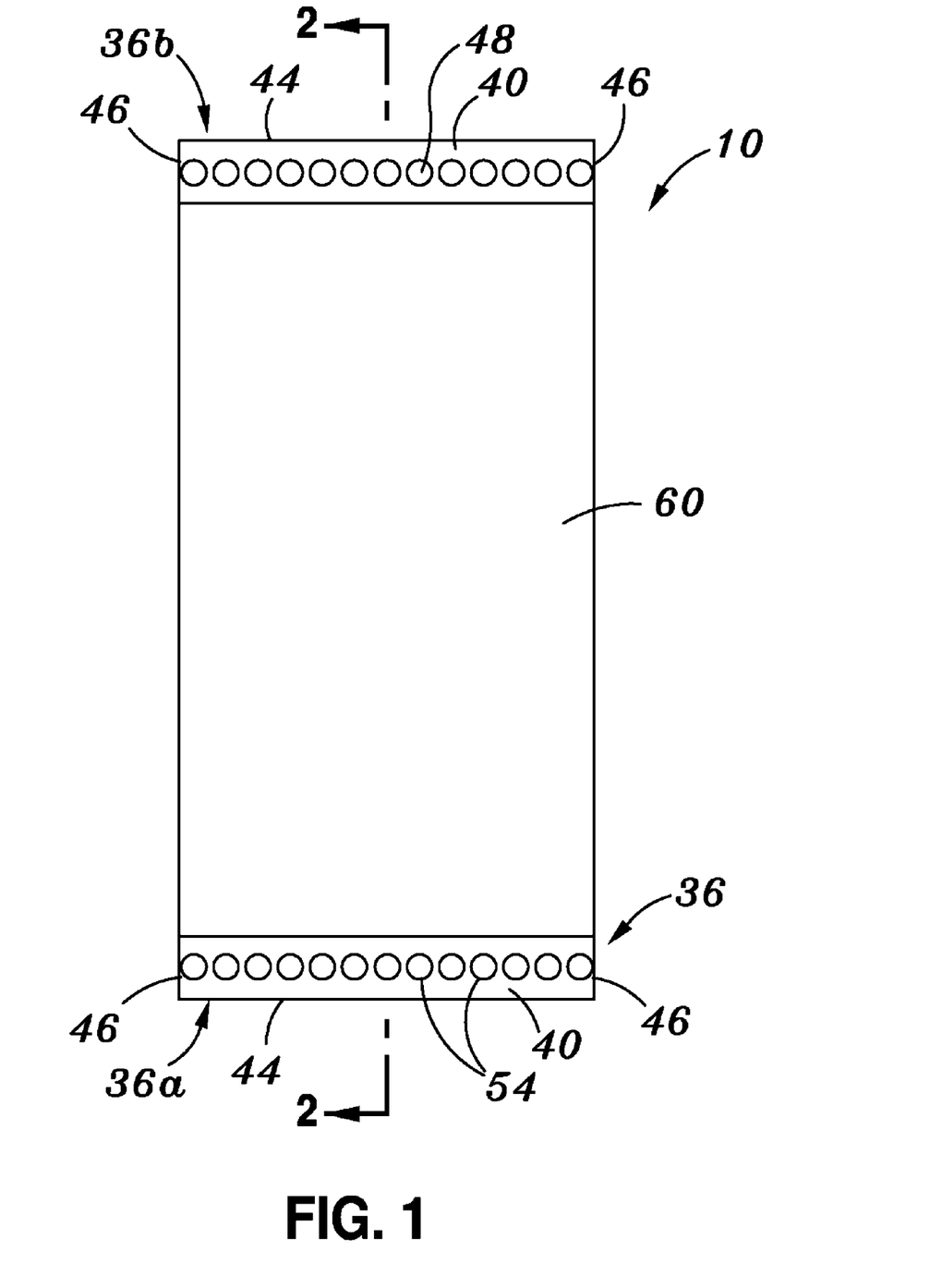
FIG. 1 is a top plan view of a semiconductor package constructed in accordance with a first embodiment of the present invention.
Figure 2:
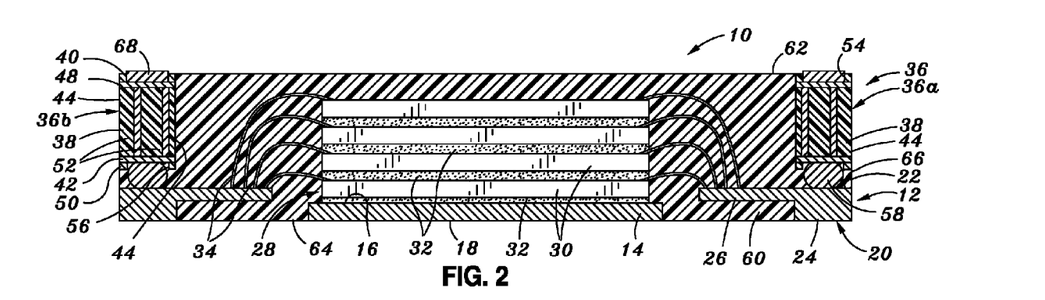
FIG. 2 is a cross-sectional view of the semiconductor package of the first embodiment of the present invention taken along line 2-2 of FIG. 1.

Referring now to the drawings wherein the showings are for purposes of illustrating various embodiments of the present invention only, and not for purposes of limiting the same, FIGS. 1 and 2 depict a semiconductor package 10 constructed in accordance with a first embodiment of the present invention. The semiconductor package 10 comprises a leadframe 12 which itself includes a die attach pad or die pad 14. In the semiconductor package 10, the die pad 14 has a generally quadrangular configuration defining four (4) peripheral edge segments. In addition, the die pad 14 defines a generally planar top surface 16, and an opposed, generally planar bottom surface 18.

In addition to the die pad 14, the leadframe 12 of the semiconductor package 10 comprises a plurality of leads 20. In the semiconductor package 10, the leads 20 are segregated into two sets, with the leads 20 of each set extending along and in spaced relation to a respective one of an opposed pair of the peripheral edge segments defined by the die pad 14. Each lead 20 preferably defines a generally planar top surface 22, and a generally planar bottom surface 24 which is disposed in opposed relation to the top surface 22. In addition to the top and bottom surfaces 22, 24, each lead 20 further defines a shoulder or shelf 26 which is recessed relative to the bottom surface 24, and extends in opposed relation to the top surface 22. The shelf 26 of each lead 20 also extends to the innermost end thereof, i.e., the end disposed closest to the die pad 14.

The leadframe 12 of the semiconductor package 10 is preferably fabricated from a conventional metal material, such as copper or copper alloy. The formation of the shelves 26 within the leads 20 and the top surface 16 of the die pad 14 is preferably facilitated by subjecting a metal plate from which the leadframe 12 is typically formed to a partial etching process. More particularly, each of the opposed, generally planar faces or sides of such metal plate preferably has an etch mask applied thereto in a manner wherein the subsequent application of a suitable etchant to the metal plate will effectively remove metal material therefrom as facilitates the formation of the top surface 16 of the die pad 14 and the recessed shelves 26 of the leads 20. Such etching process may also be used to facilitate the formation of the die pad 14 and leads 20 themselves from the original metal plate, or may be implemented so as to facilitate the formation of the top surface 16 and shelves 26 subsequent to the die pad 14 and leads 20 being defined by the completion of a stamping process upon the original metal plate.

As is further seen in FIG. 2, the partial etching process to which the die pad 14 and leads 20 are subjected is preferably completed in a manner wherein the thickness of the die pad 14 between the top and bottom surfaces 16, 18 thereof is approximately one-half of the thickness of each of the leads 20 between the top and bottom surfaces 22, 24 thereof. Similarly, the thickness of each lead 20 between the top surface 22 and the shelf 26 thereof is approximately one-half of the thickness of each lead 20 between the top and bottom surfaces 22, 24 thereof. Thus, in the leadframe 12, the bottom surfaces 18, 24 of the die pad 14 and leads 20 extend in generally co-planar relation to each other. Though the top surface 16 of the die pad 14 and the shelves 26 of the leads 20 are typically not perfectly planar due to their formation as a result of the completion of a chemical etching process, such surfaces also extend in generally co-planar relation to each other in the manner shown in FIG. 2. Though not shown, those of ordinary skill in the art will recognize that the die pad 14 may be alternately configured to have a thickness similar to that of the leads 20, such that the top surface 16 of the die pad 14 and the top surfaces 22 of the leads 20 extend in substantially coplanar relation to each other. Further, it is contemplated that that the die pad 14 may be formed to include a recessed shelf similar to the shelf 26 of each of the leads 20 or another suitable locking feature to assist in the firm interlock thereof to a package body 60 of the semiconductor package 10 which is described in detail below. Still further, it is also contemplated that the bottom surface 18 of the die pad 14 may included a recessed portion for providing a surface for adhesively bonding two stacked packages to each other, as will also be described below.

Attached to the top surface 16 of the die pad 14 is a die stack 28 of the semiconductor package 10. The die stack 28 comprises a plurality of individual semiconductor dies 30 which are arranged in a stacked configuration. In this regard, each of the semiconductor dies 30 in the die stack 28 is secured to the semiconductor die 30 below it by a layer 32 of a suitable adhesive. Similarly, the attachment of the lowermost semiconductor die 30 in the die stack 28 to the top surface 16 of the die pad 14 is facilitated by an additional adhesive layer 32. As shown in FIG. 2, four semiconductor dies 30 are depicted as being included in the die stack 28. However, those of ordinary skill in the art will recognize that the die stack 28 may be assembled to include fewer or greater than the four semiconductor dies 30 depicted in FIG. 2. In the semiconductor package 10, the pads or terminals of each of the semiconductor dies 30 of the die stack 28 are electrically connected to the leads 20 through the use of conductive wires 34. The conductive wires 34 may be fabricated from aluminum, copper, gold, silver or a functional equivalent.

The semiconductor package 10 of the present invention further comprises a laminate interposer 36 which is mounted and electrically connected to the top surfaces 22 of the leads 20. As seen in FIGS. 1 and 2, the interposer 36 comprises a first segment 36a which is electrically connected to each of the leads 20 of one of the sets thereof, and a separate second segment 36b which is electrically connected to each of the leads 20 of the remaining set thereof. The first and second segments 36a, 36b of the interposer 36 are identically configured to each other and, in the completed semiconductor package 10, extend in spaced, generally parallel relation to each other.

Each of the interposer segments 36a, 36b of the interposer 36 comprises an interposer body 38 having a top surface 40, a bottom surface 42, an opposed pair of longitudinal side surfaces 44, and an opposed pair of lateral side surfaces 46. Embedded within the interposer body 38 of each of the first and second segments 36a, 36b is a plurality of top pads 48 and bottom pads 50. The top and bottom pads 48, 50 embedded within the interposer body 38 of each of the first and second segments 36a, 36b are segregated into multiple pairs, with the top pad 48 of each pair being disposed in spaced, substantial vertical alignment with the bottom pad 50 of the same pair. As seen in FIG. 2, the top and bottom pads 48, 50 of each pair within each of the first and second segments 36a, 36b are electrically connected to each other by one or more conductive vias 52 which extend through the interposer body 38 substantially perpendicularly between the top and bottom pads 48, 50 of the corresponding pair. The top and bottom pads 48, 50 of each pair are preferably identically configured to each other, and fabricated from a suitable conductive material, as is the conductive via(s) 52 extending therebetween. Those of ordinary skill in the art will recognize that the top and bottom pads 48, 50 of each pair need not necessarily be in exact vertical alignment, and that some degree of juxtaposition therebetween is contemplated to fall within the scope of the present invention.

As further seen in FIGS. 1 and 2, formed in the top surface 40 of the interposer body 38 of each of the first and second segments 36a, 36b of the laminate interposer 36 is a plurality of top openings 54. Similarly, formed in the bottom surface 42 of the interposer body 38 of each of the first and second segments 36a, 36b is a plurality of bottom openings 56. Though depicted as being circularly configured, those of ordinary skill in the art will recognize that the top and/or bottom openings 54, 56 may be formed to have alternative shapes (e.g., square, rectangular). Exposed within each of the top openings 54 is a respective one of the top pads 48, while exposed within each of the bottom openings 56 is a respective one of the bottom pads 50. In the semiconductor package 10, each exposed bottom pad 50 in each of the first and segments 36a, 36b is electrically connected to the top surface 22 of a respective one of the leads 20 of the corresponding set thereof by a solder ball 58. It is contemplated that a conductive adhesive or solder paste may be used as an alternative to the solder balls 58. As best seen in FIG. 2, such attachment is preferably facilitated such that one of the longitudinal side surfaces 44 of each of the first and second segments 36a, 36b extends in generally co-planar relation to the outermost, generally planar distal ends of the leads 20 of the corresponding set thereof.

In the semiconductor package 10, the die stack 28, wires 34, and portions of the die pad 14, leads 20 and first and second segments 36a, 36b of the laminate interposer 36 are encapsulated or covered by an encapsulant material which, upon hardening, forms a package body 60 of the semiconductor package 10. Also fully covered by the package body 60 are the solder balls 58 used to effectuate the electrical connection between the first and second segments 36a, 36b of the laminate interposer 36 and the first and second sets of leads 20 of the leadframe 12. The fully formed package body 60 has a generally quadrangular configuration and defines a generally planar top surface 62 and an opposed, generally planar bottom surface 64. In addition to the top and bottom surfaces 62, 64, the package body 60 also defines multiple side surfaces 66. The package body 60 is preferably formed such that the bottom surfaces 18, 24 of the die pad 14 and leads 20 are each exposed in and substantially flush with the bottom surface 64. The package body 60 is further formed such that the top surface 40 of the interposer body 38 of each of the first and second segments 36a, 36b is exposed in and substantially flush with the top surface 62, with one of the longitudinal side surfaces 44 of the interposer body 38 of each of the first and second segments 36a, 36b being exposed in and substantially flush with a respective one of the side surfaces 66. Further, each of the of the lateral side surfaces 46 of the interposer body 38 of each of the first and second segments 36a, 36b is exposed in and substantially flush with a respective one of the side surfaces 66. The encapsulant material which ultimately hardens into the package body 60 under fills the leads 20 (i.e., covers the shelves 26 defined by the leads 20), thus effectively creating a mechanical interlock between the package body 60 and leads 20 embedded therein.

Figure 3:
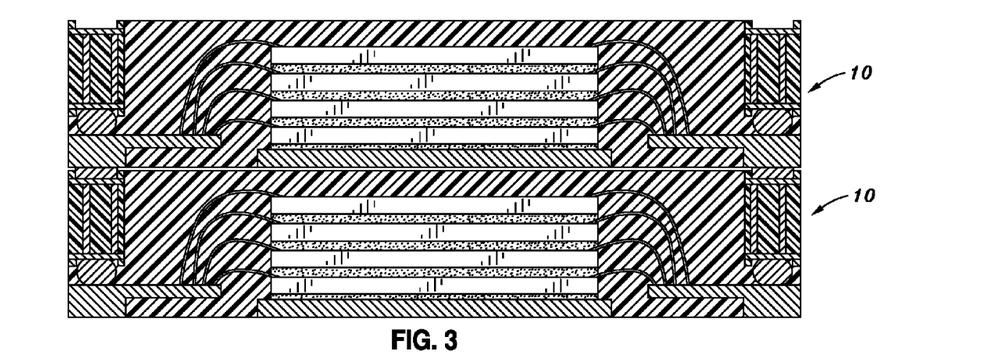
FIG. 3 is a cross-sectional view of a pair of semiconductor packages constructed in accordance with the first embodiment as arranged in a stacked configuration.

Referring now to FIG. 3, there is shown a pair of semiconductor packages 10 (each of which has the above-described structural attributes) as mechanically and electrically connected to each other in a stacked arrangement. To facilitate such stacking, the exposed bottom surfaces 24 of the leads 20 of each set within the upper semiconductor package 10 of the stack are electrically connected to respective ones of the exposed top pads 48 of a corresponding one of the first and second segments 36a, 36b of the laminate interposer 36 embedded in the package body 60 of the lower semiconductor package 10 in the stack. Such electrical connection is preferably facilitated through the use of solder layers 68, each of which is captured between one of the top pads 48 of the lower semiconductor package 10 of the stack and the bottom surfaces 24 of respective ones of the leads 20 of the upper semiconductor package 10 of the stack. Though only two semiconductor packages 10 are depicted in FIG. 3 as being stacked upon each other, those of ordinary skill in the art will recognize that the configuration of each of the semiconductor packages 10 allows for the assembly of stacks including more than two semiconductor packages 10. Additionally, if a stack is to be formed including only the two semiconductor packages 10 shown in FIG. 3, it will be recognized that the top semiconductor package 10 in the stack could be modified so as to eliminate the embedded interposer 36.

As indicated above, in the semiconductor package 10 of the first embodiment, two sets of the leads 20 are provided, with the leads 20 of each set extending along a respective one of an opposed pair of the side surfaces 66 defined by the package body 60. Additionally, as is apparent from the number of exposed top pads 48 included in each of the first and second segments 36a, 36b as depicted in FIG. 1, thirteen leads 20 are included in each set. However, those of ordinary skill in the art will recognize that fewer or greater than thirteen leads 20 (and hence fewer or greater than thirteen top pads 48 in each of the first and second segments 36a, 36b of the laminate interposer 36) may be included in each set thereof without departing from the spirit and scope of the present invention. Additionally, it is further contemplated that the leads 20 may be segregated into greater or fewer than the two sets shown in FIG. 1, and may be arranged so as to extend along one or more of the side surfaces 66 defined by the package body 60 in any combination. As will be recognized, if the leads 20 are arranged as a single set extending along only a single side surface 66 of the package body 60, such semiconductor package may include a laminate interposer 36 having only one of the above-described first and second segments 36a, 36b. Alternatively, if multiple sets of the leads 20 are provided so as to extend along respective ones of each of the side surfaces 66 of the body 60, the laminate interposer 36 may be formed to have a continuous, ring-like or frame-like configuration.

Figure 4:
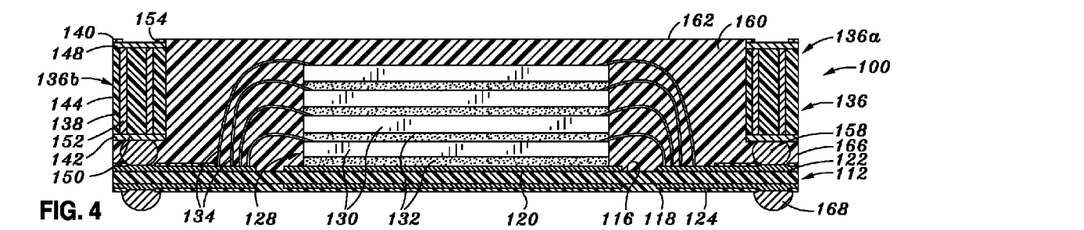
FIG. 4 is a cross-sectional view of a semiconductor package constructed in accordance with a second embodiment of the present invention.

Referring now to FIG. 4, there is depicted a semiconductor package 100 constructed in accordance with a second embodiment of the present invention. The semiconductor package 100 comprises a laminate substrate 112 which has a generally quadrangular configuration defining four (4) peripheral edge segments. In addition, the substrate 112 defines a generally planar top surface 116, and an opposed, generally planar bottom surface 118. Disposed in the approximate center of the top surface 116 of the substrate 112 is a generally quadrangular die pad 120 thereof. Also disposed on the top surface 116 is a plurality of top contacts 122 of the substrate 112. In the substrate 112, the contacts 122 are segregated into two sets, with the contacts 122 of each set extending along and in spaced relation to a respective one of an opposed pair of the peripheral edge segments defined by the die pad 120. Formed on the bottom surface 118 of the substrate 112 is a plurality of bottom contacts 124. In the semiconductor package 100, the top and bottom contacts 122, 124 are preferably segregated into multiple pairs, with the top contact 122 of each pair being disposed in spaced, substantial vertical alignment with the bottom contact 124 of the same pair. Though not shown, the top and bottom contacts 122, 124 of each pair are electrically connected to each other by conductive vias which extend through the substrate 112. However, those of ordinary skill in the art will recognize that each top contact 122 may be electrically connected to one or more bottom contacts 124 other than for the bottom contact 124 in vertical alignment therewith. Further, the top and bottom contacts 122, 124 of each pair are preferably identically configured to each other, and fabricated from a suitable conductive material, as is any conductive via extending therebetween.

Attached to the die pad 120 of the substrate 112 is a die stack 128 of the semiconductor package 100. The die stack 128 comprises a plurality of individual semiconductor dies 130 which are arranged in a stacked configuration. In this regard, each of the semiconductor dies 130 in the die stack 128 is secured to the semiconductor die 130 below it by a layer 132 of a suitable adhesive. Similarly, the attachment of the lowermost semiconductor die 130 in the die stack 128 to the die pad 120 is facilitated by an additional adhesive layer 132. As shown in FIG. 4, four semiconductor dies 130 are depicted as being included in the die stack 128. However, those of ordinary skill in the art will recognize that the die stack 128 may be assembled to include fewer or greater than the four semiconductor 130 dies depicted in FIG. 4. In the semiconductor package 100, the pads or terminals of each of the semiconductor dies 130 of the die stack 128 are electrically connected to the top contacts 122 through the use of conductive wires 134. The conductive wires 134 may be fabricated from aluminum, copper, gold, silver or a functional equivalent. Though not shown in FIG. 4, it is contemplated that that lowermost one of the semiconductor dies 130 in the stack thereof may be electrically connected to the underlying substrate 122 through the use of a flip-chip connection as an alternative to the use of the wires 134.

The semiconductor package 100 further comprises a laminate interposer 136 which is mounted and electrically connected to the top contacts 122 of the substrate. As seen in FIG. 4, the interposer 136 comprises a first segment 136a which is electrically connected to each of the top contacts 122 of one of the sets thereof, and a separate second segment 136b which is electrically connected to each of the top contacts 122 of the remaining set thereof. The first and second segments 136a, 136b of the interposer 136 are identically configured to each other and, in the completed semiconductor package 100, extend in spaced, generally parallel relation to each other.

Each of the interposer segments 136a, 136b of the interposer 136 comprises an interposer body 138 having a top surface 140, a bottom surface 142, an opposed pair of longitudinal side surfaces 144, and an opposed pair of lateral side surfaces. Embedded within the interposer body 138 of each of the first and second segments 136a, 136b is a plurality of top pads 148. Additionally, disposed on the bottom surface 142 of the interposer body 138 of each of the first and second segments 136a, 136b is a plurality of bottom pads 150. The top and bottom pads 148, 150 of each of the first and second segments 136a, 136b are segregated into multiple pairs, with the top pad 148 of each pair being disposed in spaced, substantial vertical alignment with the bottom pad 150 of the same pair. As seen in FIG. 4, the top and bottom pads 148, 150 of each pair within each of the first and second segments 136a, 136b are electrically connected to each other by one or more conductive vias 152 which extend through the interposer body 138 substantially perpendicularly between the top and bottom pads 148, 150 of the corresponding pair. The top and bottom pads 148, 150 of each pair are preferably identically configured to each other, and fabricated from a suitable conductive material, as is the conductive via(s) 152 extending therebetween. Those of ordinary skill in the art will recognize that the top and bottom pads 148, 150 of each pair need not necessarily be in exact vertical alignment, and that some degree of juxtaposition therebetween is contemplated to fall within the scope of the present invention.

Formed in the top surface 140 of the interposer body 138 of each of the first and second segments 136a, 136b of the laminate interposer 136 is a plurality of circularly configured top openings 154. Exposed within each of the top openings 154 is a respective one of the top pads 148. In the semiconductor package 100, each bottom pad 150 in each of the first and segments 136a, 136b is electrically connected to a respective one of the top contacts 122 of the corresponding set thereof by a solder ball 158. As best seen in FIG. 4, such attachment is preferably facilitated such that one of the longitudinal side surfaces 144 of each of the first and second segments 136a, 136b extends in generally co-planar relation to a respective one of the sides or peripheral edge segments defined by the substrate 112. Formed on each of the bottom contacts of the substrate 122 is a solder bump 168, the use of which will be described in more detail below.

In the semiconductor package 100, the die stack 128, wires 134, and portions of the substrate 112 and first and second segments 136a, 136b of the laminate interposer 136 are encapsulated or covered by an encapsulant material which, upon hardening, forms a package body 160 of the semiconductor package 100. Also fully covered by the package body 160 are the solder balls 158 used to effectuate the electrical connection between the first and second segments 136a, 136b of the laminate interposer 136 and the first and second sets of top contacts 122 of the substrate 112. The fully formed package body 160 has a generally quadrangular configuration and defines a generally planar top surface 162 and an opposed, generally planar bottom surface which contacts the top surface 116 of the substrate 112. The package body 160 also defines multiple side surfaces 166. The package body 160 is preferably formed such that the bottom surface 118 of the substrate 112 is not covered thereby. The package body 160 is further formed such that the top surface 140 of the interposer body 138 of each of the first and second segments 136a, 136b is exposed in and substantially flush with the top surface 162, with one of the longitudinal side surfaces 144 of the interposer body 138 of each of the first and second segments 136a, 136b being exposed in and substantially flush with a respective one of the side surfaces 166. Further, each of the of the lateral side surfaces of the interposer body 138 of each of the first and second segments 136a, 136b is exposed in and substantially flush with a respective one of the side surfaces 166.

Figure 5:
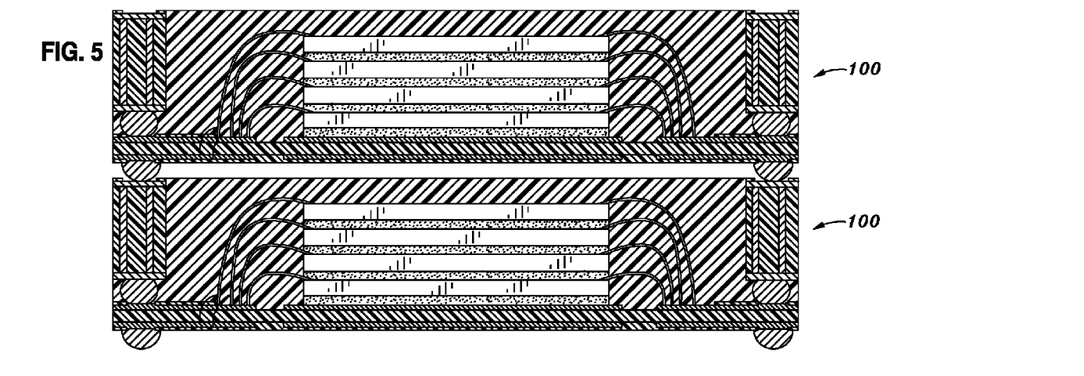
FIG. 5 is a cross-sectional view of a pair of semiconductor packages constructed in accordance with the second embodiment as arranged in a stacked configuration.

Referring now to FIG. 5, there is shown a pair of semiconductor packages 100 (each of which has the above-described structural attributes) as mechanically and electrically connected to each other in a stacked arrangement. To facilitate such stacking, the solder bumps 168 formed on the exposed portions of bottom contacts 124 of each set within the upper semiconductor package 100 of the stack are electrically connected to respective ones of the exposed top pads 148 of a corresponding one of the first and second segments 136a, 136b of the laminate interposer 136 embedded in the package body 160 of the lower semiconductor package 100 in the stack. Such electrical connection is preferably facilitated through the reflow of the solder bumps 168. Though only two semiconductor packages 100 are depicted in FIG. 5 as being stacked upon each other, those of ordinary skill in the art will recognize that the configuration of each of the semiconductor packages 100 allows for the assembly of stacks including more than two semiconductor packages 100. Additionally, if a stack is to be formed including only the two semiconductor packages 100 shown in FIG. 5, it will be recognized that the top semiconductor package 100 in the stack could be modified so as to eliminate the embedded interposer 136.

As indicated above, in the semiconductor package 100 of the second embodiment, two sets of the top contacts 122 are provided on the substrate 112, with the top contacts 122 of each set extending along a respective one of an opposed pair of the side surfaces 166 defined by the package body 160. The top plan view of the completed semiconductor package 100 is identical to that of the semiconductor package 10 as shown in FIG. 1. However, it is contemplated that the top contacts 122 may be segregated into greater or fewer than the two sets, and may be arranged so as to extend along one or more of the side surfaces 166 defined by the package body 160 in any combination. As will be recognized, if the top contacts 122 are arranged as a single set extending along only a single side surface 166 of the package body 160, such semiconductor package may include a laminate interposer 136 having only one of the above-described first and second segments 136a, 136b. Alternatively, if multiple sets of the top contacts 122 are provided so as to extend along respective ones of each of the side surfaces 166 of the body 160, the laminate interposer 136 may be formed to have a continuous, ring-like or frame-like configuration.

Figure 6:
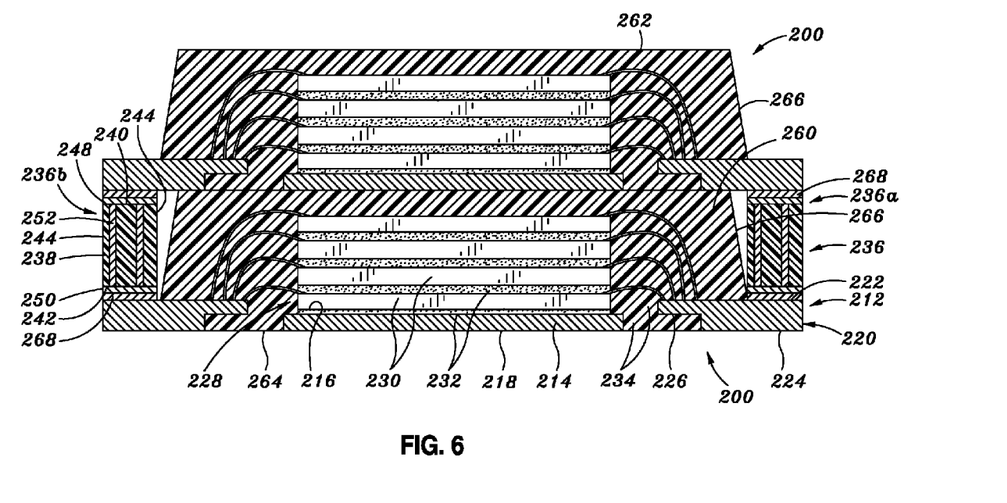
FIG. 6 is a cross-sectional view of a pair of semiconductor packages as arranged in a stacked configuration through the use of an interposer constructed in accordance with a third embodiment of the present invention.

Referring now to FIG. 6, there is depicted a chip stack comprising a stacked pair of identically configured semiconductor packages 200, the electrical connection between the stacked semiconductor packages 200 being effectuated by a laminate interposer 236. Each of the semiconductor packages 200 comprises a leadframe 212 which itself includes a die attach pad or die pad 214. The die pad 214 has a generally quadrangular configuration defining four (4) peripheral edge segments. In addition, the die pad 214 defines a generally planar top surface 216, and an opposed, generally planar bottom surface 218.

In addition to the die pad 214, the leadframe 212 of each of the semiconductor packages 200 comprises a plurality of leads 220. The leads 220 of each semiconductor package 200 are segregated into two sets, with the leads 220 of each set extending along and in spaced relation to a respective one of an opposed pair of the peripheral edge segments defined by the die pad 214. Each lead 220 preferably defines a generally planar top surface 222, and a generally planar bottom surface 224 which is disposed in opposed relation to the top surface 222. In addition to the top and bottom surfaces 222, 224, each lead 220 further defines a shoulder or shelf 226 which is recessed relative to the bottom surface 224, and extends in opposed relation to the top surface 222. The shelf 226 of each lead 220 also extends to the innermost end thereof, i.e., the end disposed closest to the die pad 214.

The leadframe 212 of each semiconductor package 200 is preferably fabricated from a conventional metal material, such as copper or copper alloy. The formation of the shelves 226 within the leads 220 and the top surface 216 of the die pad 214 is preferably facilitated by subjecting a metal plate from which the leadframe 212 is typically formed to a partial etching process. More particularly, each of the opposed, generally planar faces or sides of such metal plate preferably has an etch mask applied thereto in a manner wherein the subsequent application of a suitable etchant to the metal plate will effectively remove metal material therefrom as facilitates the formation of the top surface 216 of the die pad 214 and the recessed shelves 226 of the leads 220. Such etching process may also be used to facilitate the formation of the die pad 214 and leads 220 themselves from the original metal plate, or may be implemented so as to facilitate the formation of the top surface 216 and shelves 226 subsequent to the die pad 214 and leads 220 being defined by the completion of a stamping process upon the original metal plate.

As is further seen in FIG. 6, the partial etching process to which the die pad 214 and leads 220 are subjected is preferably completed in a manner wherein the thickness of the die pad 214 between the top and bottom surfaces 216, 218 thereof is approximately one-half of the thickness of each of the leads 220 between the top and bottom surfaces 222, 224 thereof. Similarly, the thickness of each lead 220 between the top surface 222 and the shelf 226 thereof is approximately one-half of the thickness of each lead 220 between the top and bottom surfaces 222, 224 thereof. Thus, in the leadframe 212, the bottom surfaces 218, 224 of the die pad 214 and leads 220 extend in generally co-planar relation to each other. Though the top surface 216 of the die pad 214 and the shelves 226 of the leads 220 are typically not perfectly planar due to their formation as a result of the completion of a chemical etching process, such surfaces also extend in generally co-planar relation to each other in the manner shown in FIG. 6.

Attached to the top surface of the die pad 214 is a die stack 228 of the semiconductor package 200. The die stack 228 comprises a plurality of individual semiconductor dies 230 which are arranged in a stacked configuration. In this regard, each of the semiconductor dies 230 in the die stack 228 is secured to the semiconductor die 230 below it by a layer 232 of a suitable adhesive. Similarly, the attachment of the lowermost semiconductor die 230 in the die stack 228 to the die pad 214 is facilitated by an additional adhesive layer 232. As shown in FIG. 6, four semiconductor dies 230 are depicted as being included in the die stack 228. However, those of ordinary skill in the art will recognize that the die stack 228 may be assembled to include fewer or greater than the four semiconductor dies 230 depicted in FIG. 6. In each semiconductor package 200, the pads or terminals of each of the semiconductor dies 230 of the corresponding die stack 228 are electrically connected to the leads 220 through the use of conductive wires 234. The conductive wires 234 may be fabricated from aluminum, copper, gold, silver or a functional equivalent.

In each semiconductor package 200, the die stack 228, wires 234, and portions of the die pad 214 and leads 220 are encapsulated or covered by an encapsulant material which, upon hardening, forms a package body 260 of the semiconductor package 200. The fully formed package body 260 has a generally quadrangular configuration and defines a generally planar top surface 262 and an opposed, generally planar bottom surface 264. In addition to the top and bottom surfaces 62, 64, the package body 60 also defines multiple, sloped or tapered side surfaces 266. The package body 260 is preferably formed such that the bottom surfaces 218, 224 of the die pad 214 and leads 220 are each exposed in and substantially flush with the bottom surface 264. The package body 260 is further formed such that portions of the leads 220 protrude from respective side surfaces 266, thus resulting in portions of the top surfaces 222 of the leads 220 not being covered by the package body 260 and thus exposed in the semiconductor package 200. The encapsulant material which ultimately hardens into the package body 260 under fills the leads 220 (i.e., covers the shelves 226 defined by the leads 220), thus effectively creating a mechanical interlock between the package body 260 and leads 220 embedded therein.

In the chip stack shown in FIG. 6, the upper and lower semiconductor packages 200 are electrically and mechanically connected to each other by a laminate interposer 236 which is mounted and electrically connected to the exposed portions of the top surfaces 222 of the leads 220 of the lower semiconductor package 200 of the stack and to the bottom surfaces 224 of the leads 220 of the upper semiconductor package 200 of the stack. The interposer 236 comprises a first segment 236a which is electrically connected to each of the leads 220 of one of the sets included in each of the semiconductor packages 200, and a separate second segment 236b which is electrically connected to each of the leads 220 of the remaining set included in each of the semiconductor packages 200. The first and second segments 236a, 236b of the interposer 236 are identically configured to each other and, in the chip stack, extend in spaced, generally parallel relation to each other.

Each of the interposer segments 236a, 236b of the interposer 236 comprises an interposer body 238 having a top surface 240, a bottom surface 242, an opposed pair of longitudinal side surfaces 244, and an opposed pair of lateral side surfaces. Disposed on the top surface 240 of the interposer body 238 of each of the first and second segments 236a, 236b is a plurality of top pads 248. Additionally, disposed on the bottom surface 242 of the interposer body 238 of each of the first and second segments 236a, 236b is a plurality of bottom pads 250. The top and bottom pads 248, 250 of each of the first and second segments 236a, 236b are segregated into multiple pairs, with the top pad 248 of each pair being disposed in spaced, substantial vertical alignment with the bottom pad 250 of the same pair. As seen in FIG. 6, the top and bottom pads 248, 250 of each pair within each of the first and second segments 236a, 236b are electrically connected to each other by one or more conductive vias 252 which extend through the interposer body 238 substantially perpendicularly between the top and bottom pads 248, 250 of the corresponding pair. The top and bottom pads 248, 250 of each pair are preferably identically configured to each other, and fabricated from a suitable conductive material, as is the conductive via(s) 252 extending therebetween.

To facilitate the formation of the chip stack shown in FIG. 6, the exposed portions of the top surfaces 222 of the leads 220 of each set within the lower semiconductor package 200 of the stack are electrically connected to respective ones of the bottom pads 250 of a corresponding one of the first and second segments 236a, 236b of the laminate interposer 236. Such electrical connection is preferably facilitated through the use of solder layers 268. Similarly, the exposed bottom surfaces 224 of the leads 220 of each set within the upper semiconductor package 200 of the stack are electrically connected to respective ones of the top pads 248 of a corresponding one of the first and second segments 236a, 236b of the laminate interposer 236 through the use of the solder layers 268. In order to improve reliability, the bottom surface 264 of the package body 260 and/or the bottom surface 218 of the die pad 214 of the top semiconductor package 200 in the stack may be adhesively attached to the top surface 262 of the package body 260 of the bottom semiconductor package 200 in the stack through the use of an adhesive. Because the exposed bottom surface 218 of the die pad 214 typically has a surface finish that is not compatible with adhesives, a half etched region may be added into the bottom surface 218 of the die pad 214 in each semiconductor package 200 to provide an area that will be compatible with adhesive materials. The same holds true in relation to the bottom surface 18 of the die pad 14 of the semiconductor package 10 shown in FIGS. 2 and 3. Though only two semiconductor packages 200 are depicted in FIG. 6 as being stacked upon each other, those of ordinary skill in the art will recognize that the configuration of each of the semiconductor packages 200 allows for the assembly of stacks including more than two semiconductor packages 200.

As indicated above, in each of the semiconductor package 200, two sets of the leads 220 are provided, with the leads 220 of each set extending along a respective one of an opposed pair of the side surfaces 266 defined by the package body 260. However, those of ordinary skill in the art will recognize that the leads 220 may be segregated into greater or fewer than the two sets, and may be arranged so as to extend along one or more of the side surfaces 266 defined by the package body 260 in any combination. As will be recognized, if the leads 220 are arranged as a single set extending along only a single side surface 266 of the package body 260, the chip stack may include a laminate interposer 236 having only one of the above-described first and second segments 236a, 236b. Alternatively, if multiple sets of the leads 220 are provided so as to extend along respective ones of each of the side surfaces 266 of the body 260, the laminate interposer 236 integrated into the chip stack may be formed to have a continuous, ring-like or frame-like configuration.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a die pad defining opposed top and bottom pad surfaces;
   a plurality of leads which each define opposed top and bottom lead surfaces and extend at least partially about the die pad in spaced relation thereto;
   at least one semiconductor die attached to the top pad surface of the die pad and electrically connected to at least some the leads;
   a laminate interposer electrically connected to at least some of the leads and defining opposed top and bottom interposer surfaces, the laminate interposer being configured to route electrical signals from the leads to the top interposer surface thereof; and a package body defining opposed top and bottom surfaces and a side surface, the package body at least partially encapsulating the die pad, the leads, and the semiconductor die such that at least a portion of the bottom lead surface of each of the leads is exposed in the bottom surface of the package body.

2. The semiconductor package of claim 1 wherein a plurality of semiconductor dies are attached to the top pad surface of the die pad in a stacked arrangement, each of the semiconductor dies being electrically connected to at least one of the leads and encapsulated by the package body.

3. The semiconductor package of claim 1 wherein the interposer comprises:
   an interposer body defining the top and bottom interposer surfaces;
   a plurality of top pads exposed in the top interposer surface;
   a plurality of bottom pads exposed in the bottom interposer surface and electrically connected to the top lead surfaces of respective ones of at least some of the leads; and
   a plurality of conductive vias extending through the interposer body and electrically connecting each of the top pads to at least one of the bottom pads.

4. The semiconductor package of claim 1 wherein:
   the die pad has a generally quadrangular configuration defining multiple peripheral edge segments;
   the leads are segregated into at least two sets which extend along respective ones of at least two of the peripheral edge segments of the die pad; and
   the interposer comprises separate first and second segments which are electrically connected to respective ones of the sets of the leads.

5. The semiconductor package of claim 4 wherein the first and second segments of the interposer each comprise:
   an interposer body defining the top and bottom interposer surfaces;
   a plurality of top pads exposed in the top interposer surface;
   a plurality of bottom pads exposed in the bottom interposer surface and electrically connected to the top lead surfaces of respective ones of at least some of the leads; and
   a plurality of conductive vias extending through the interposer body and electrically connecting each of the top pads to at least one of the bottom pads.

6. The semiconductor package of claim 1 wherein the semiconductor die is electrically connected to the leads by conductive wires which are covered by the package body.

7. The semiconductor package of claim 1 wherein each of the leads further defines a lead shelf which is recessed relative to the bottom lead surface, disposed in opposed relation to the top lead surface, and extends to a inner end thereof, the lead shelf being covered by the package body.

8. The semiconductor package of claim 1 wherein at least a portion of the bottom pad surface of the die pad is exposed in the bottom surface of the package body.

9. The semiconductor package semiconductor package of claim 1 further in combination with a second semiconductor package comprising:
   a die pad defining opposed top and bottom pad surfaces;
   a plurality of leads which each define opposed top and bottom lead surfaces and extend at least partially about the die pad in spaced relation thereto;
   at least one semiconductor die attached to the top pad surface of the die pad and electrically connected to at least some the leads; and
   a package body defining opposed top and bottom surfaces and a side surface, the package body at least partially encapsulating the die pad, the leads, and the semiconductor die such that at least a portion of the bottom lead surface of each of the leads is exposed in the bottom surface of the package body
   the laminate interposer being electrically connected to the bottom surfaces of at least some of the leads of the second semiconductor package.

10. A semiconductor package, comprising:
    a die pad defining opposed top and bottom pad surfaces;
    a plurality of leads which each define opposed top and bottom lead surfaces and extend at least partially about the die pad in spaced relation thereto;
    at least one semiconductor die attached to the top pad surface of the die pad and electrically connected to at least some the leads;
    a package body defining opposed top and bottom surfaces and a side surface, the package body at least partially encapsulating the die pad, the leads, and the semiconductor die such that portions of at least some of the leads protrude from the side surface of the package body and are exposed; and
    a laminate interposer electrically connected to the exposed portions of the leads.

11. The semiconductor package of claim 10 wherein a plurality of semiconductor dies are attached to the top pad surface of the die pad in a stacked arrangement, each of the semiconductor dies being electrically connected to at least one of the leads and encapsulated by the package body.

12. The semiconductor package of claim 10 wherein the interposer comprises:
    an interposer body defining the top and bottom interposer surfaces;
    a plurality of top pads exposed in the top interposer surface and electrically connected to the exposed portions of at least some of the leads of the semiconductor package;
    a plurality of bottom pads exposed in the bottom interposer surface; and
    a plurality of conductive vias extending through the interposer body and electrically connecting each of the top pads to at least one of the bottom pads.

13. The semiconductor package of claim 10 wherein the interposer comprises:
    an interposer body defining the top and bottom interposer surfaces;
    a plurality of top pads exposed in the top interposer surface;
    a plurality of bottom pads exposed in the bottom interposer surface and electrically connected to the exposed portions of at least some of the leads of the semiconductor package; and
    a plurality of conductive vias extending through the interposer body and electrically connecting each of the top pads to at least one of the bottom pads.

14. The semiconductor package of claim 10 wherein:
    the die pad has a generally quadrangular configuration defining multiple peripheral edge segments;
    the leads are segregated into at least two sets which extend along respective ones of at least two of the peripheral edge segments of the die pad; and
    the interposer comprises separate first and second segments which are electrically connected to respective ones of the sets of the leads.

15. The semiconductor package of claim 14 wherein the first and second segments of the interposer each comprise:
    an interposer body defining the top and bottom interposer surfaces;
    a plurality of top pads exposed in the top interposer surface;
    a plurality of bottom pads exposed in the bottom interposer surface and electrically connected to the top lead surfaces of respective ones of at least some of the leads; and a plurality of conductive vias extending through the interposer body and electrically connecting each of the top pads to at least one of the bottom pads.

16. The semiconductor package of claim 14 wherein the first and second segments of the interposer each comprise:
an interposer body defining the top and bottom interposer surfaces;
a plurality of top pads exposed in the top interposer surface and electrically connected to the bottom lead surfaces of respective ones of at least some of the leads;
a plurality of bottom pads exposed in the bottom interposer surface; and
a plurality of conductive vias extending through the interposer body and electrically connecting each of the top pads to at least one of the bottom pads.

17. The semiconductor package of claim 10 wherein each of the leads further defines a lead shelf which is recessed relative to the bottom lead surface, disposed in opposed relation to the top lead surface, and extends to a inner end thereof, the lead shelf being covered by the package body.

18. The semiconductor package semiconductor package of claim 10 further in combination with a second semiconductor package comprising:
a die pad defining opposed top and bottom pad surfaces;
a plurality of leads which each define opposed top and bottom lead surfaces and extend at least partially about the die pad in spaced relation thereto;
at least one semiconductor die attached to the top pad surface of the die pad and electrically connected to at least some the leads; and
a package body defining opposed top and bottom surfaces and a side surface, the package body at least partially encapsulating the die pad, the leads, and the semiconductor die such that portions of at least some of the leads protrude from the side surface of the package body and are exposed;
the laminate interposer being electrically connected to the exposed portions of at least some of leads of the second semiconductor package.

19. A semiconductor package, comprising:
a die pad;
a plurality of leads which extend at least partially about the die pad in spaced relation thereto;
at least one semiconductor die attached to the die pad and electrically connected to at least some the leads;
a package body at least partially encapsulating the die pad, the leads, and the semiconductor die such that portions of at least some of the leads are exposed in the package body; and
a laminate interposer electrically connected to the exposed portions of at least some of the leads.

* * * * *